(12) United States Patent
Solal

(10) Patent No.: US 7,576,471 B1
(45) Date of Patent: Aug. 18, 2009

(54) SAW FILTER OPERABLE IN A PISTON MODE

(75) Inventor: Marc Solal, Longwood, FL (US)

(73) Assignee: Triquint Semiconductor, Inc., Orlando, FL (US)

( * ) Notice: Subject to any disclaimer, the term of this patent is extended or adjusted under 35 U.S.C. 154(b) by 0 days.

(21) Appl. No.: 11/863,479

(22) Filed: Sep. 28, 2007

(51) Int. Cl.
*H01L 41/09* (2006.01)

(52) U.S. Cl. .................................. 310/313 B

(58) Field of Classification Search ............. 310/313 D, 310/313 B, 313 R; 333/193, 195, 196; *H01L 41/09*
See application file for complete search history.

(56) References Cited

U.S. PATENT DOCUMENTS

| | | | |
|---|---|---|---|
| 5,831,492 A | 11/1998 | Solie | |
| 6,121,860 A * | 9/2000 | Tsutsumi et al. | 310/313 D |
| 6,841,918 B2 | 1/2005 | Kando | |
| 6,960,866 B2 | 11/2005 | Kando | |
| 7,075,390 B1 | 7/2006 | Bungo et al. | |
| 7,170,376 B2 * | 1/2007 | Mills et al. | 335/202 |
| 7,187,101 B2 | 3/2007 | Kidoh | |
| 2007/0018755 A1 | 1/2007 | Mayer et al. | |

OTHER PUBLICATIONS

Markus Mayer, Andreas Bergmann, Gunter Kovacs and Karl Wagner; "Low Loss Recursive Filters for Basestation Applications Without Spurious Modes"; 2005 IEEE Ultrasonics Symposium; pp. 1061-1064.

* cited by examiner

*Primary Examiner*—Quyen Leung
*Assistant Examiner*—Karen B Addison
(74) *Attorney, Agent, or Firm*—Allen, Dyer, Doppelt, Milbrath & Gilchrist, P.A.

(57) ABSTRACT

A SAW transducer includes a pair of opposing bus bars formed on a surface of a piezoelectric substrate with a plurality of interdigital electrodes extending from each of the opposing bus bars. A center region and opposing edge regions are formed, wherein each edge region is proximate each bus bar and includes free end portions of the electrodes such that a wave velocity in each edge region is substantially lower than a wave velocity in the bus bars and in the center region, and wherein electro-acoustic sources extend into the edge regions for providing a SAW transducer having the piezoelectrically excited strongest mode is a piston mode with an amplitude distribution generally flat across most of the resonator area.

18 Claims, 13 Drawing Sheets

SAW FILTER OPERABLE IN A PISTON MODE

FIELD OF THE INVENTION

The present invention generally relates to surface acoustic wave (SAW) filters and more particularly to SAW transducers where the piezoelectrically excited strongest mode is a piston mode having an amplitude distribution generally flat across most of a central portion of the transducer aperture.

BACKGROUND OF THE INVENTION

An undesirable feature and often difficult problem to solve when designing a narrow band SAW filter, especially on quartz, is presented by a presence of transverse modes. With a finite aperture for a SAW device, several guided modes can propagate instead of one. The effect of these transverse modes is to add several other undesirable responses to an otherwise ideal filter response, shifted in frequency and to a lower level. The result can produce both ripple in the pass band and spurious rejection. Several approaches have been used to solve this problem.

One approach reduces the transducer aperture, which reduces the number of guided modes and thereby increases their frequency difference. Typically, the aperture will be chosen in order to have only one guided mode. The drawback of this approach is that a small aperture has to be chosen, resulting in high impedances.

Another approach is to apodize the transducer in order to get more coupling to the main mode and to reduce the coupling to the other modes. While this method results in some improvement, it is limited by the main transverse mode extending outside of the acoustic aperture, making it difficult to construct an apodization desirably reproducing the mode shape.

Figure 1:
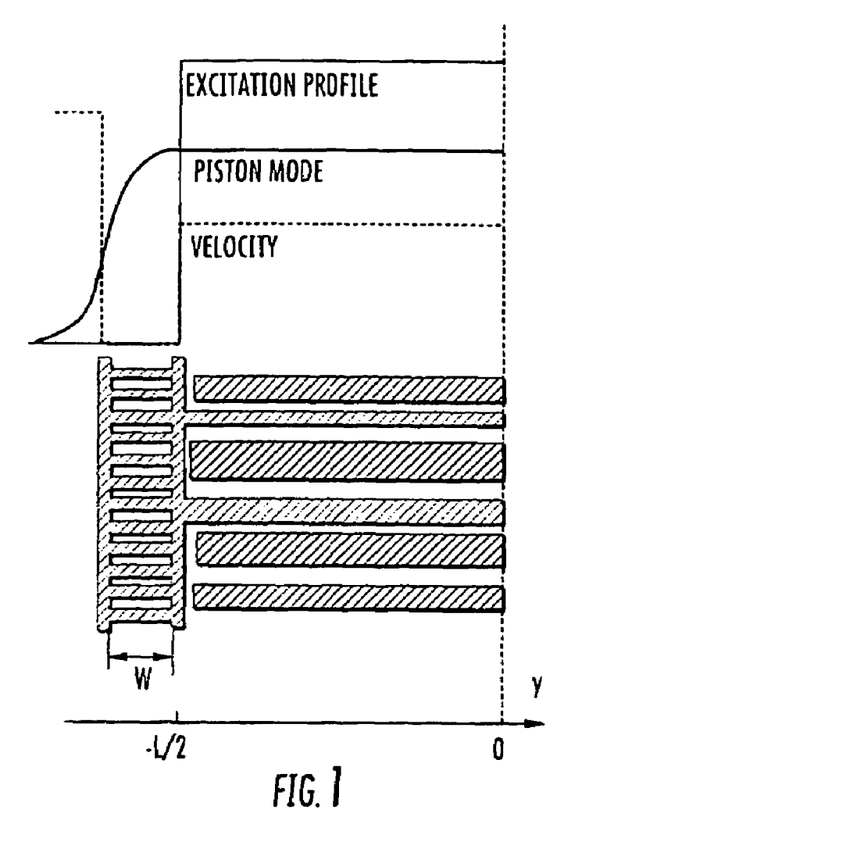
FIG. 1 is a diagrammatical illustration of a known transducer and response illustrating a change in velocity in a transverse direction for one excitation profile of a piston mode transducer.
Figure 1A:
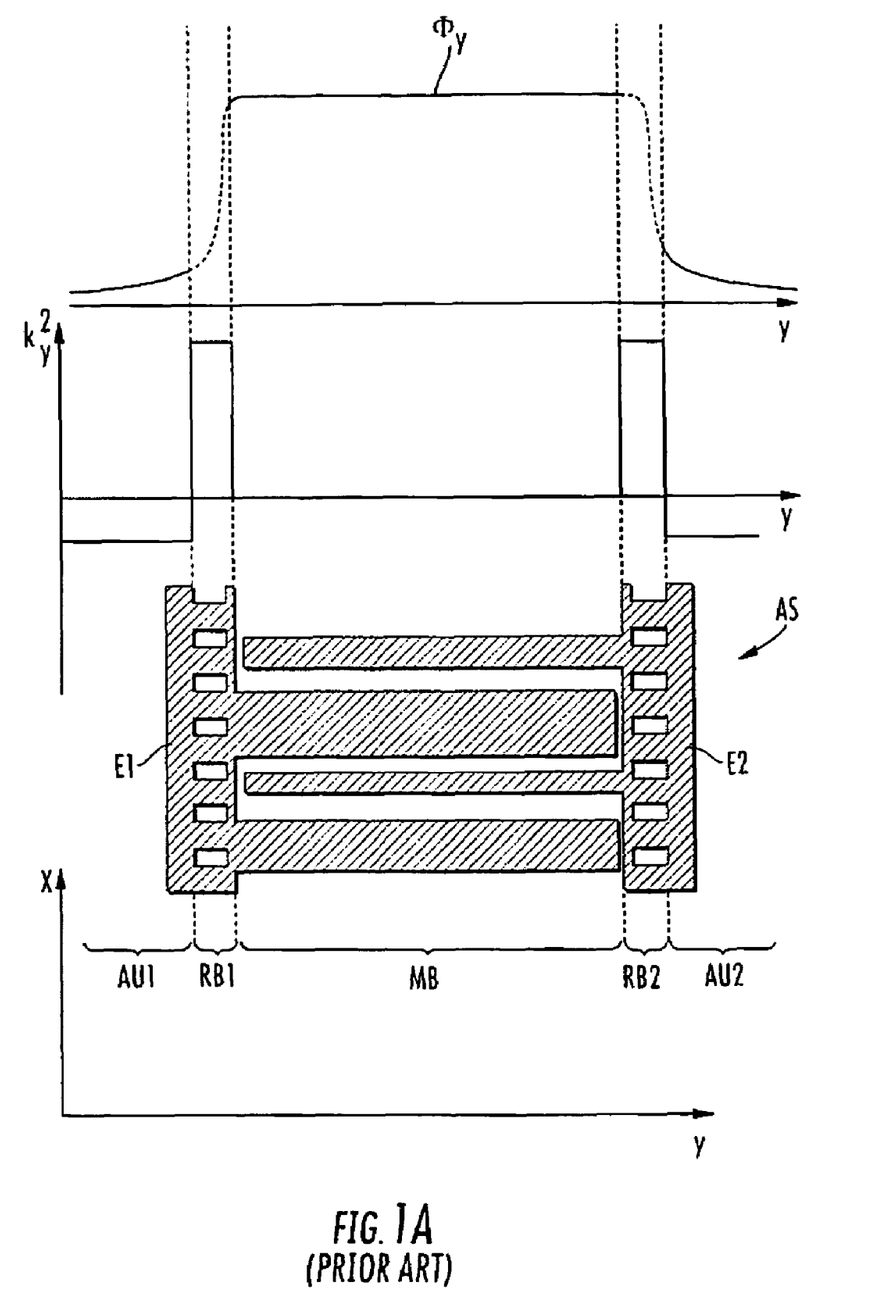
FIG. 1A is a diagrammatical illustration of a known transducer and response illustrating a change in wave number in a transverse direction and a shape of one basic mode.

Yet another approach was described in a publication to M. Mayer et al. for Low Loss Recursive SAW Filter for Base Station Applications without Spurious Modes' (2005 IEEE Ultrasonics Symposium, proceedings pp 1061-1064) and in US Patent Application Publication No. US 2007/0018755 A1 to Mayer et al. for Acoustic Wave Transducer with Transverse Mode Suppression, the disclosures of which are herein incorporated by reference in their entirety. A proposed alternate solution is similar to the piston mode approach in BAWs is illustrated in publication for "Design Modeling ands Visualization for Low Transverse Modes R-SPUDT Devices. As illustrated with reference to FIG. 1, the principle is to add a lower wave velocity region to the edge of the transducer so as to produce a mode constant in the aperture and decreasing outside, as further illustrated with reference to FIG. 1A. The shape of this mode is close to the rectangular shape of the source so that only this mode should be excited. A region with smaller electrode period is used so that the velocity is decreased as a result of the topographic effect. A velocity shift is proportional to the number of electrodes per wavelength. Such an approach may be used in a single phase unidirectional transducer (SPUDT), by way of example. Some improvements in the filter response result, but parasitics still remain. The present invention seeks to further improve an implementation of such a piston mode device.

SUMMARY

The present invention teaches SAW transducers that may include a pair of opposing bus bars formed on a surface of a piezoelectric substrate with a plurality of interdigital electrodes extending from each of the opposing bus bars. A center region and opposing edge regions are formed, wherein each edge region is proximate each bus bar and includes free end portions of the electrodes such that a wave velocity in each edge region is substantially lower than the wave velocity in the bus bars and in the center region, and wherein electroacoustic sources extend into the edge regions for providing a SAW transducer having the piezoelectrically excited strongest mode is a piston mode with an amplitude distribution generally flat across most of the central portion of the transducer aperture.

In keeping with the teachings of the present invention, an embodiment of the invention may have the velocity and the electrode widths in the edge regions chosen to have a propagating mode substantially flat in the center region. An embodiment may have a metal thickness of the electrode portions in the edge region greater than the metal thickness of the electrodes in the center region so as to result in the substantially lower velocity in the edge region. An embodiment may have a duty factor for electrode portions in the edge region greater than the duty factor of the electrodes in the center region so as to result in the substantially lower velocity in the edge region. Yet another embodiment may have a dielectric layer on a top surface of the electrode portions in the edge region and not on the electrodes in the center region so as to result in the substantially lower velocity in the edge region, may have a dielectric layer on a bottom surface of the electrode portions in the edge region and not on the electrodes in the center region so as to result in the substantially lower velocity in the edge region, or a combination thereof.

Embodiments of the invention may include SAW transducers, wherein more acoustic energy is generated by the transducer in one direction or is more sensitive to the acoustic energy coming from the one direction. Further, a SAW transducer may have acoustic reflectors, and wherein directionality is a result of acoustic reflections. The acoustic reflectors may be present in the edge regions. A cell in the edge region may comprise 7/16λ wide reflectors and 3/16λ wide source electrodes, where λ is the acoustic wavelength. The SAW transducer may form at least a portion of a SAW filter, may be employed in a SPUDT filter.

BRIEF DESCRIPTION OF DRAWINGS

Features and benefits of the present invention will become apparent as the description proceeds when taken in conjunction with the accompanying drawings in which.

DETAILED DESCRIPTION OF EMBODIMENTS

The present invention will now be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Figure 2:
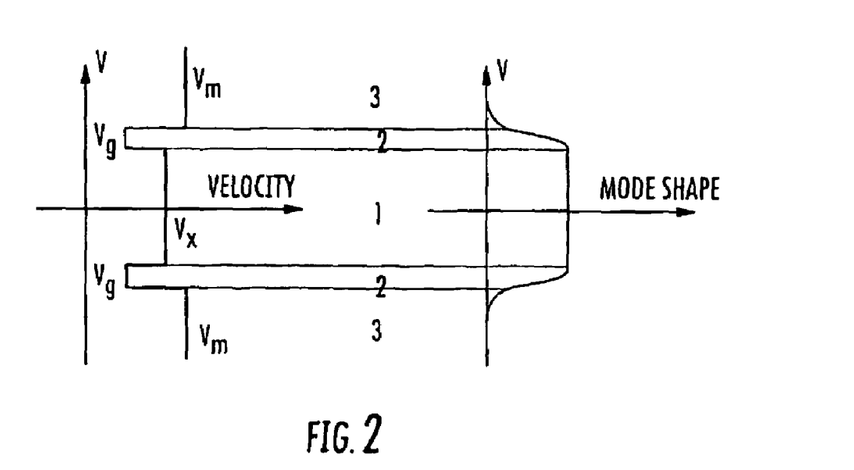
FIG. 2 is diagrammatical illustration of a piston mode SAW device velocity and mode shape in keeping with the teachings of the present invention.

Referring now to FIG. 2, consider a transducer being described by three transverse regions including a center region, an edge region and a bus bar region. With such a transducer, it is generally straightforward to compute velocities and shapes of various guided modes using a scalar potential approach. As illustrated with continued reference to FIG. 2, a piston mode is characterized by a flat amplitude in the center region, an exponentially decreasing amplitude in the bus bars and a sine or cosine shape in the edge region. For the piston mode to exist, the wave number $k_x$ in the propagation direction corresponds to a value for $k_y$ of zero or approximately equal to zero in the transverse direction in the center region with the amplitude profile being generally flat in the center. The corresponding transverse wave numbers in the edge and the bus bar regions allow the continuity of amplitude and derivative of the amplitude. It is possible to compute and approximately determine the aperture W of the edge region from waves velocities Vx, Vm and Vg in the transducer center, the bus bar, and the edge regions, respectively.

By way of example, using a parabolic approximation for the substrate anisotropy and assuming small velocities differences between the regions, the result is:

$$\frac{Wf}{V_x\sqrt{1+\gamma}} = \frac{\arctan\left(\sqrt{\frac{\Delta_m}{-\Delta_g}}\right)}{2\pi\sqrt{-2\Delta_g}}$$

Where $$V_m = V_x(1+\Delta_m)$$

$$V_g = V_x(1+\Delta_g)$$

and wherein γ is the coefficient characterizing the anisotropy of the substrate.

Since for the piston mode, the amplitude is flat in the center, it can be noticed than the edge aperture does not depend on the transducer aperture. In addition this edge aperture becomes smaller when the velocity in the edge region decreases. Typical values for edge apertures are some wavelengths (3 to 5).

It is well known that the level of the spurious due to the transverse modes is related to the integral of the transverse mode shape on the transducer aperture. In other words, this level for the $i^{th}$ mode, normalized to the main mode is:

$$\frac{\int_{sourceaperture} g_i(x)\,dx}{\int_{sourceaperture} g_o\,dx}.$$

Figure 3:
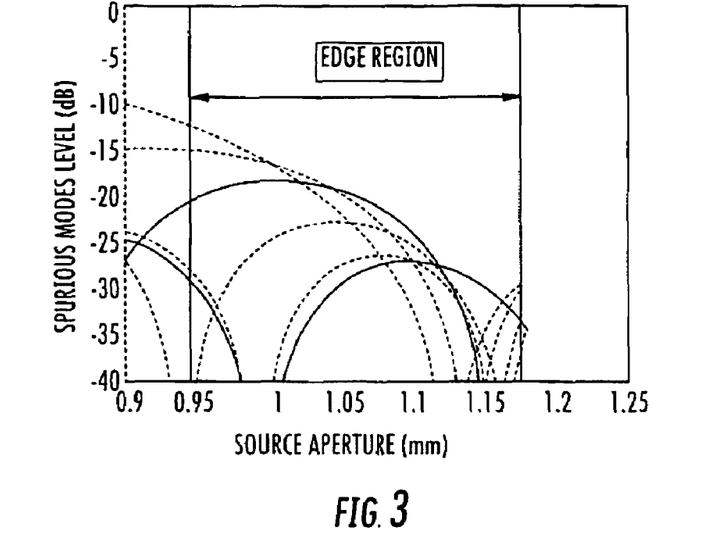
FIG. 3 illustrates the variation of the relative spurious mode amplitudes with the source aperture.

With reference to FIG. 3, variations in spurious levels for different modes versus the source aperture are illustrated by way of example. With continued reference to FIG. 3, estimated relative levels of several spurious modes as a function of the source aperture are illustrated. The left vertical line represents the boundary of the center region while the right vertical line is the boundary between the edge and the bus bar. The levels are normalized to the level of the main mode. This result is given by way of example for the case of a 199 MHz SPUDT filter. It is clearly shown that the maximum spurious level is in the range of −12 dB in the case where the source aperture does not extend into the edge region, while it decreases when the source aperture extends into the edge region. Therefore, it is advantageous to have the source aperture extending into the edge region.

Figure 4:
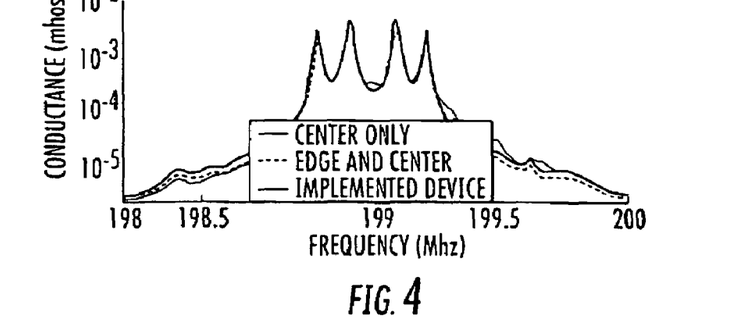
FIG. 4 illustrates a conductance for different configurations, wherein for dotted line, the source extends in the center region only; for solid line (an implemented device), the source extends both in the edge and the center regions; and for dashed line, the source and reflectivity extending in both in the edge and the center regions.
Figure 4A:
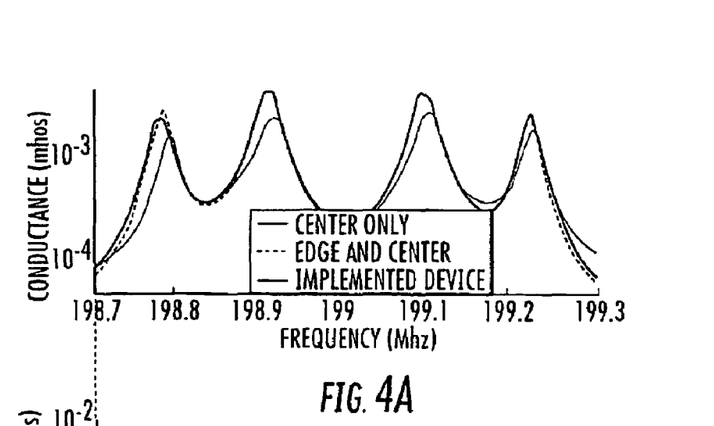
FIG. 4A is an expanded region of FIG. 4 herein illustrated for convenience in reading the plot of conductance versus frequency.

FIG. 4 illustrates simulations of conductance of the SPUDT filter herein described by using different source apertures, as well as with and without the piston edge source. This illustrates the impact of the presence of reflectivity in the edge region. It is clearly seen that the results are improved when both reflection and transduction are inside the edge region. For clarity and not illustrated in FIG. 4, but in the case where the edge region comprises sources but no reflectors, the results are negatively changed since the edge region is no longer unidirectional. To summarize, the source aperture preferably extends into the edge region. This gives less coupling to the spurious modes. Better results are also obtained if the reflectivity extends also in the low velocity region. In addition, for the structure herein illustrated by way of example, desirable results are obtained when the source aperture extends into essentially the entire edge regions, while for different devices, desirable results are expected to be obtained when the source aperture extends only partly within the edge region. But in all cases, results have been shown to be more desirable than when the source aperture extends only in the center region.

Figure 5:
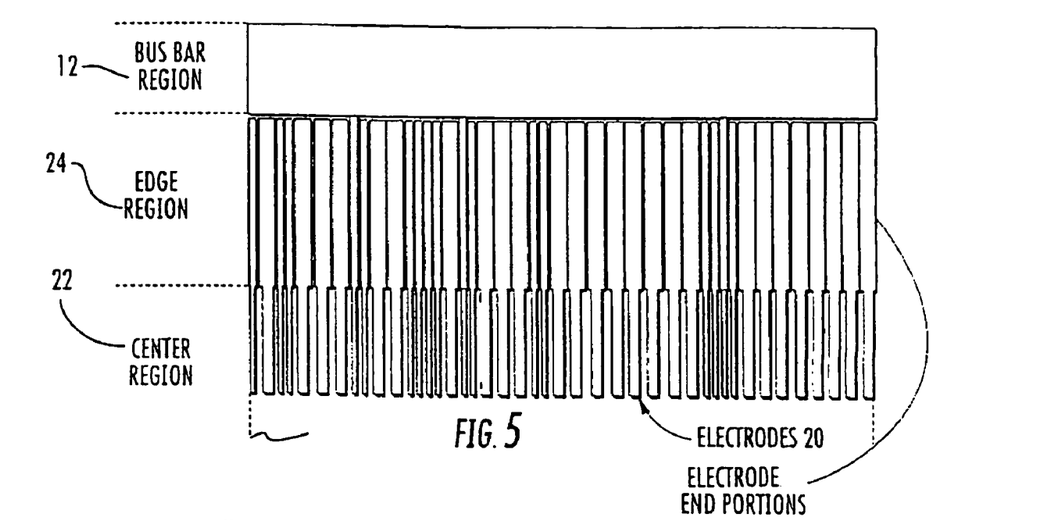
FIG. 5 is a diagrammatical plan view illustrating bus bar, edge region, and center regions of a piston mode device in keeping with the teachings of the present invention.
Figure 6:
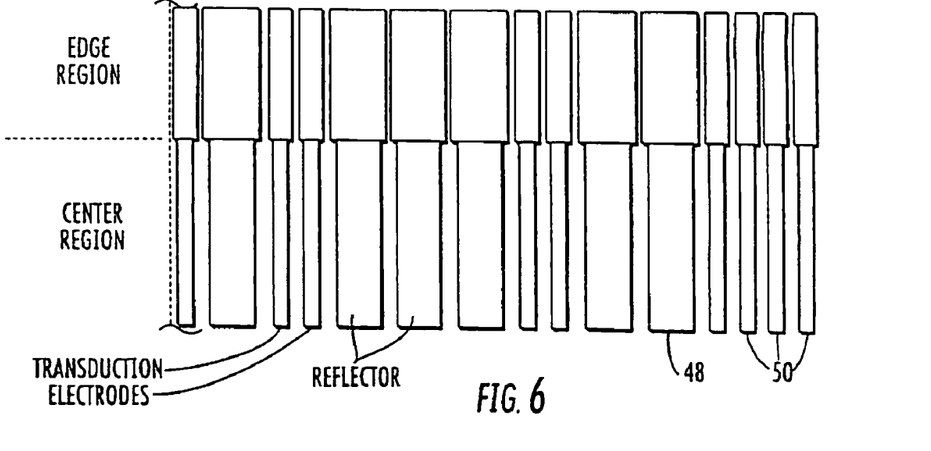
FIG. 6 is an enlarged view of a portion of FIG. 5.

The chosen implementation for the piston mode device has to respect these principles. Various approaches may be employed to reduce the velocity at the edge region while keeping sources and reflectors within the edge region, including:

increasing the metal thickness in the edge region
adding dielectric material at the edge region
increasing the duty factor at the edge region For the embodiment herein described by way of example, the duty factor in the edge region is increased. This is done while keeping the same SPUDT structure, that is keeping sources and reflectors where there are sources and reflectors in the transducer, as illustrated with reference to FIGS. 5 and 6.

Figure 7:
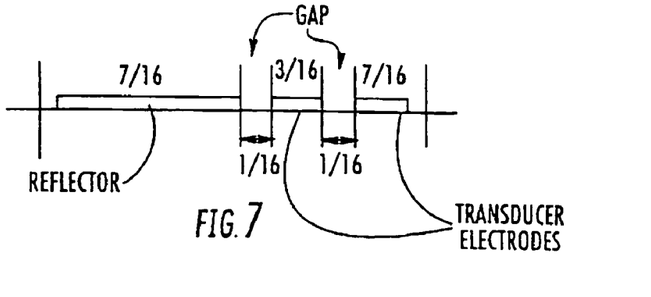
FIG. 7 illustrates a cross sectional view for one cell of FIG. 5.

The duty factor is increased so that the minimum gap is $\lambda/16$ instead of $\lambda/8$ when EWC (electrode width controlled) or DART (distributed array reflector transducer) cells are used in the center region. The duty factor of the reflectors as well as the transducer are increased both so that the gap between reflector and transducer is the same as the gap between two reflectors or the gap between two transducers. This is obtained for a reflector width of $0.4375\lambda$ and a transducer width of $0.1875\lambda$. A basic cell is illustrated with reference to FIG. 7.

Figure 8:
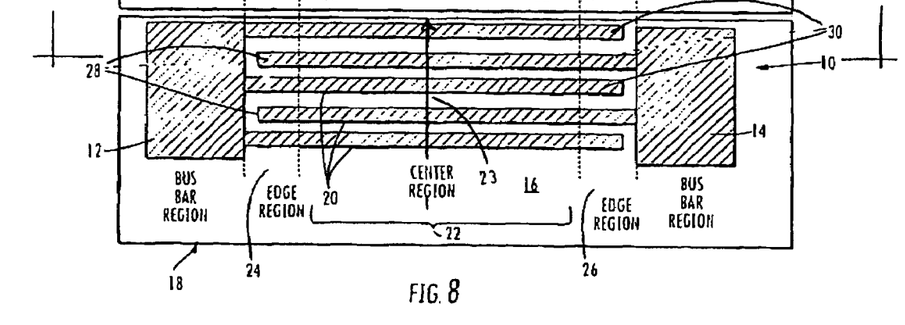
FIGS. 8 and 8A are diagrammatical top plan and cross sectional views, respectively, for a SAW transducer in keeping with the teachings of the present invention, the cross sectional view taken through lines 8A-8A of FIG. 8.

An embodiment of the invention may be described with reference to FIG. 8 as a SAW transducer 10 including a pair of opposing bus bars 12, 14 formed on a surface 16 of a piezoelectric substrate 18 with a plurality of interdigital electrodes 20 extending from each of the opposing bus bars. A center region 22 and opposing edge regions 24, 26 are formed along a propagation axis 23 which is perpendicular to the electrodes 20, wherein each edge region 24, 26 is proximate each cooperating bus bar 12, 14, respectively. Free end portions 28, 30 of the electrodes 20 are such that a wave velocity in each edge region 24, 26 is substantially lower than a wave velocity in the bus bars 12, 14 and in the center region 22, as above described with reference to FIG. 2. The transducer 10 is constructed such that electro-acoustic sources extend into the edge regions 24, 26 for providing a piezoelectrically excited strongest mode as a piston mode with an amplitude distribution generally flat across most of the center region of the transducer aperture. By way of example, reference will now be made to FIGS. 8A through 14 for transducer embodiments in keeping with the teachings of the present invention.

Figure 8A:
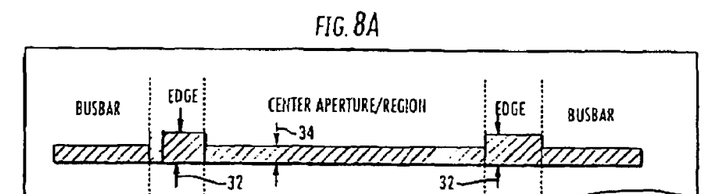

With reference again to FIG. 8 and now to FIG. 8A, an embodiment of the transducer 10 may have a metal thickness 32 of the electrode portions in the edge region greater than a metal thickness 34 of the electrodes 20 in the center region 22 so as to result in the substantially lower velocity in the edge regions 24, 26. FIG. 8A illustrates by way of example using an extra aluminum layer in the edge region. For simplicity, only two electrodes per wavelength transducers is shown, but one of skill in the art will appreciate that the teachings of the invention apply to any kind of transducer including a SPUDT. For simplicity also, the source aperture extends within the whole edge region but one of skill in the art will appreciate that the teachings of the invention apply when the source extends only partly within the edge region.

Figures 9, 9A:
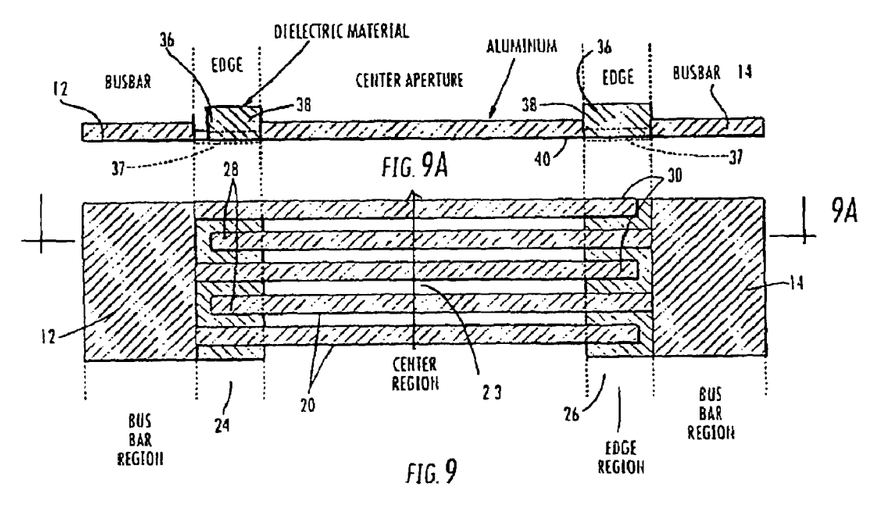
FIGS. 9 and 9A are diagrammatical top plan and cross sectional views, respectively, for another embodiment including a dielectric layer on a surface of electrode portions in edge regions, the cross sectional view taken through lines 9A-9A of FIG. 9.

As illustrated with reference to FIGS. 9 and 9A, yet another embodiment may have a dielectric layer 36 on a top surface 38 of the electrode portions 28, 30 in the edge regions 24, 26 and not on the electrodes 20 in the center region 22 so as to result in the substantially lower velocity in the edge region. A dielectric layer 37 may be placed on a bottom surface 40 of the electrode portions in the edge region and not on the electrodes in the center region so as to result in the substantially lower velocity in the edge region, or a combination thereof.

With reference to FIGS. 10-13, embodiments of the invention may have the velocity and the width of electrodes in the edge regions chosen to have a propagating mode substantially flat in the center region. Additionally, a duty factor or width of electrode portions in the edge region may be greater than the duty factor of the electrodes in the center region so as to result in the substantially lower velocity in the edge region.

Figure 10:
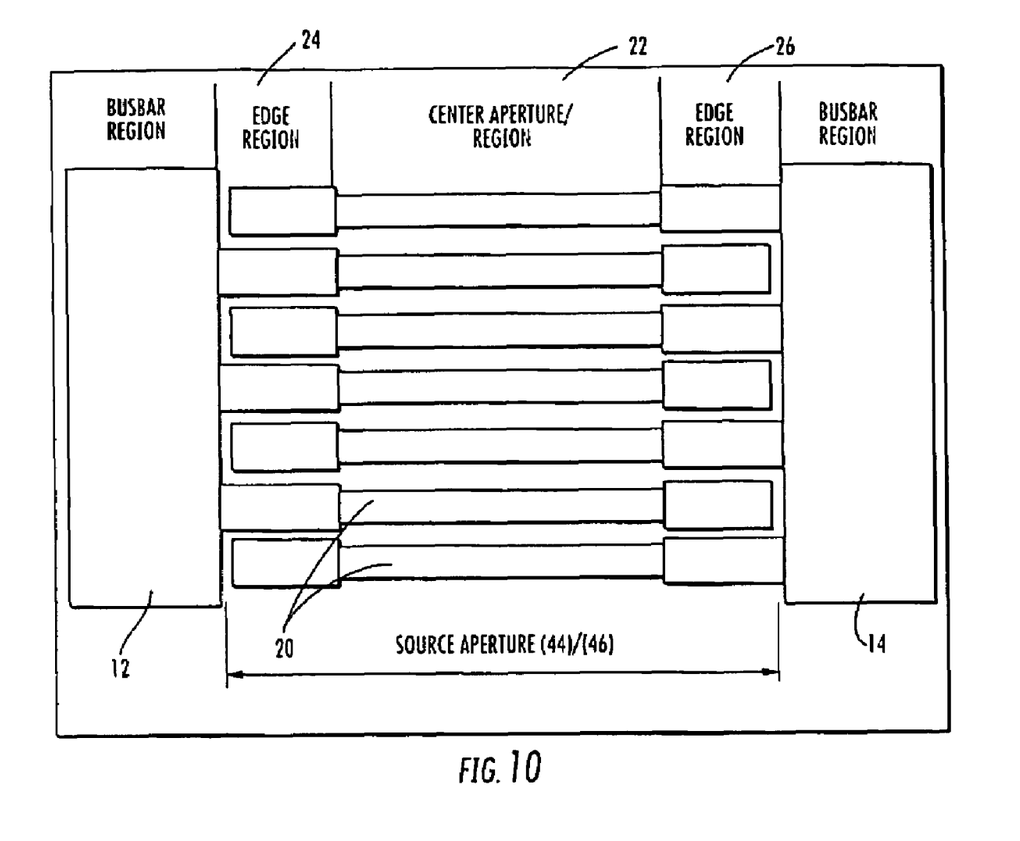
FIGS. 10 and 11 are diagrammatical plan views of embodiments of the invention further illustrating the center region, bus bar region, and edge region, wherein the source extends entirely across and partially across the transducer, respectively.
Figure 11:
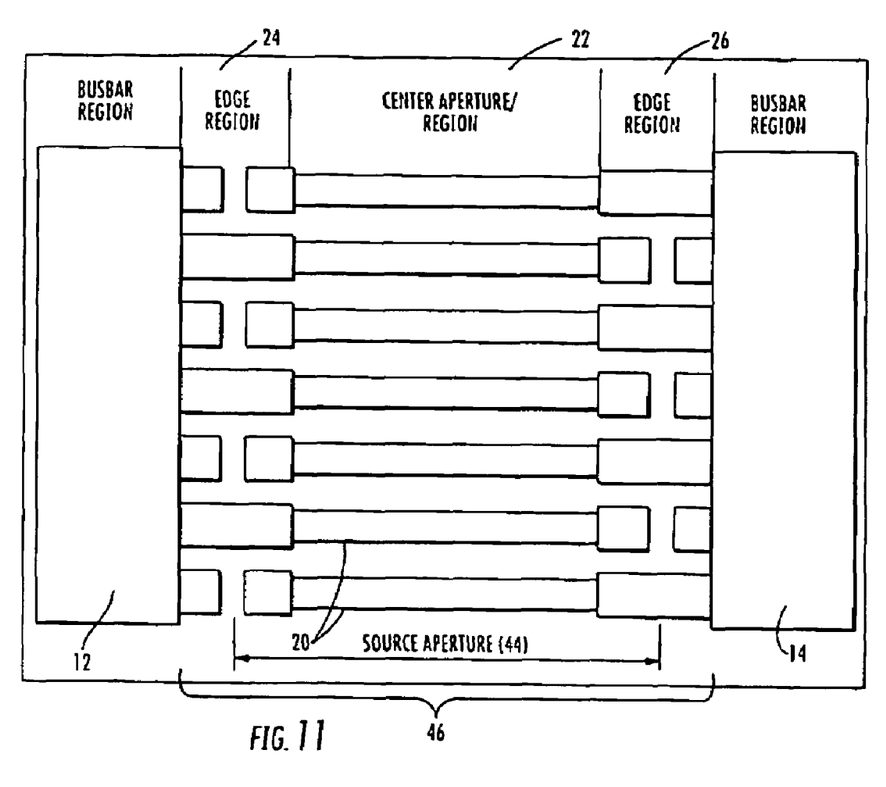

With reference to FIG. 10, using a simple two electrodes per wavelength transducer by way of example, one embodiment of the transducer may use larger electrode widths (duty factor) in the edge regions to reduce the velocity in the edge region and have sources extending in the whole edge region is illustrated. As illustrated with reference to FIG. 11, again using a simple two electrodes per wavelength transducer by way of example, the transducer may use larger electrode widths (and larger duty factor) to reduce the velocity in the edge region and have sources extending partly into the edge region.

Figure 12:
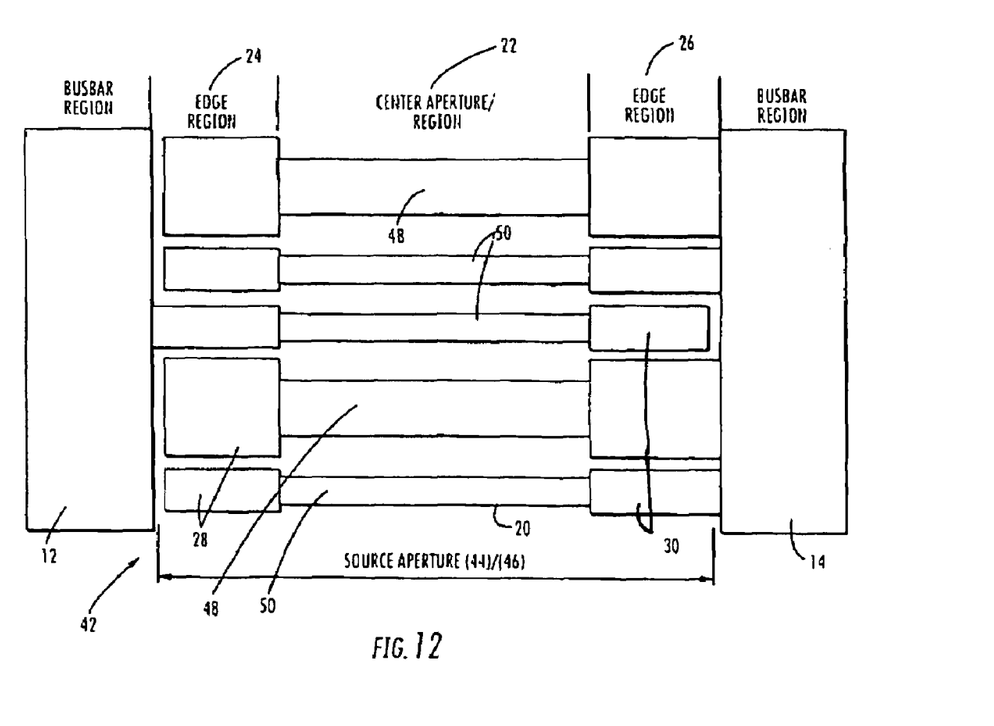
FIGS. 12 and 13 are diagrammatical plan views of SPUDT structures having a wave velocity and a width dimension of electrode portions in the edge regions chosen to have a propagating mode substantially flat in the center region, wherein a duty factor for electrode portions in the edge may be region greater than the duty factor of the electrodes in the center region.
Figure 13:
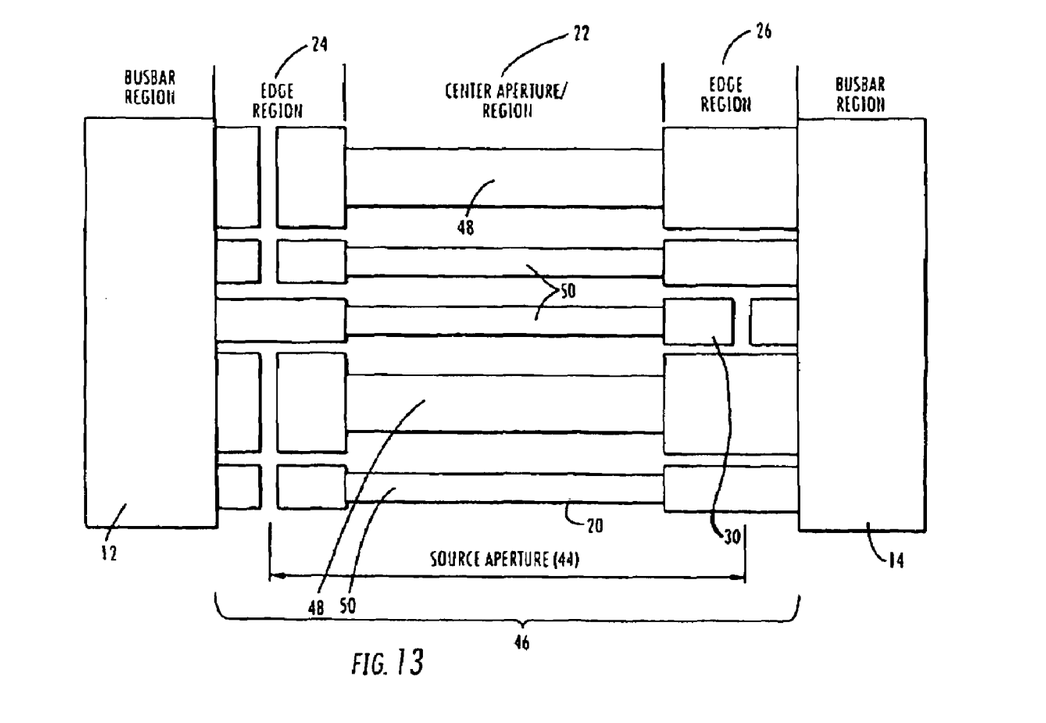

By way of further example with reference to FIG. 12, a SPUDT structure 42 is illustrated wherein the transducer comprises reflector electrodes 48 and transduction electrodes 50, and the velocity change in the edge region is accomplished by increasing the electrode width (and thus the duty factor), and have the source extending substantially across the edge regions. FIG. 13 illustrates a SPUDT structure wherein the velocity change in the edge is accomplished by increasing the electrode width (and thus duty factor) and by having the source aperture 44 extends only partly into the edge regions 24, 26.

Figure 14:
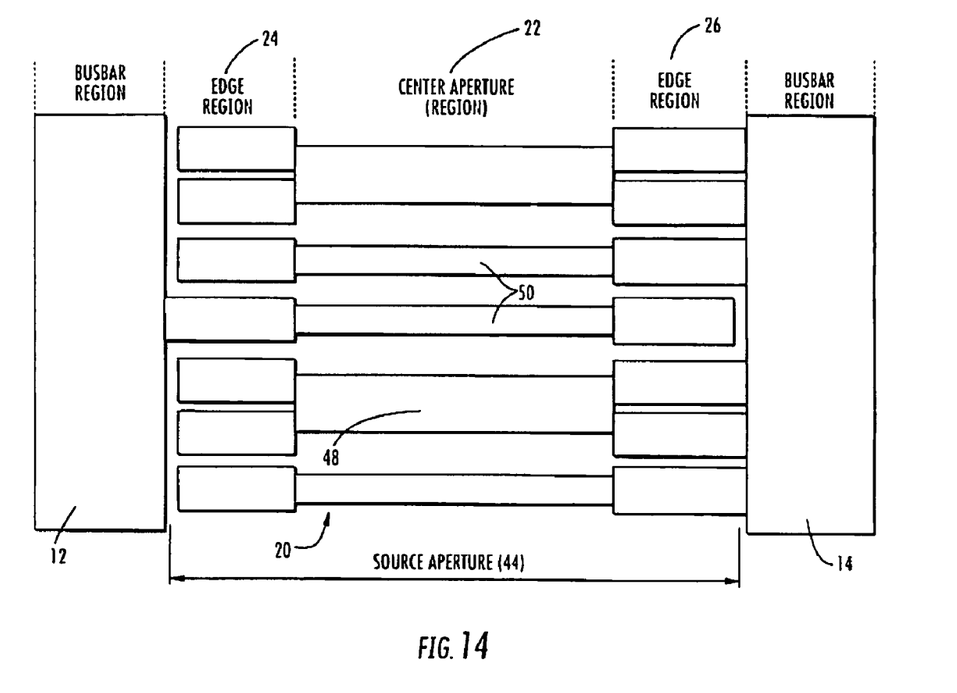
FIG. 14 is a diagrammatical plan view illustrating one SPUDT structure where the velocity change in the edge is accomplished by increasing the electrode width, a source aperture extends within the whole transducer aperture between bus bars, and reflectors extending only into the center region.

The structure illustrated with reference to FIG. 14 is an example of one SPUDT where the velocity change in the edge is accomplished by increasing the electrode width, have the source extends within the whole aperture between bus bars, with reflectors extending only into the center region. As illustrated, in the edge region, each reflector is replaced by two split electrodes of period lambda/4 such that reflections cancel.

Figure 15:
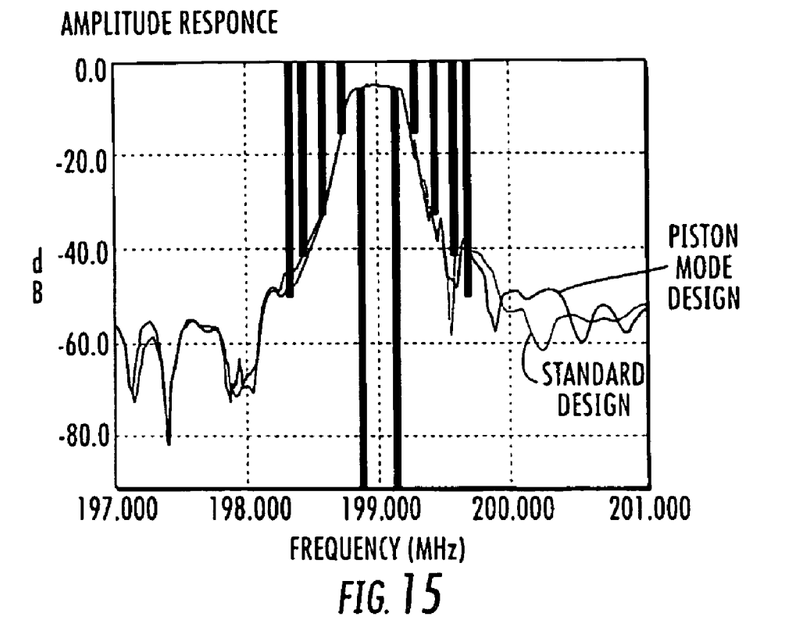
FIGS. 15-17 illustrate frequency responses for one filter by way of example in keeping with the teachings of the present invention.
Figure 16:
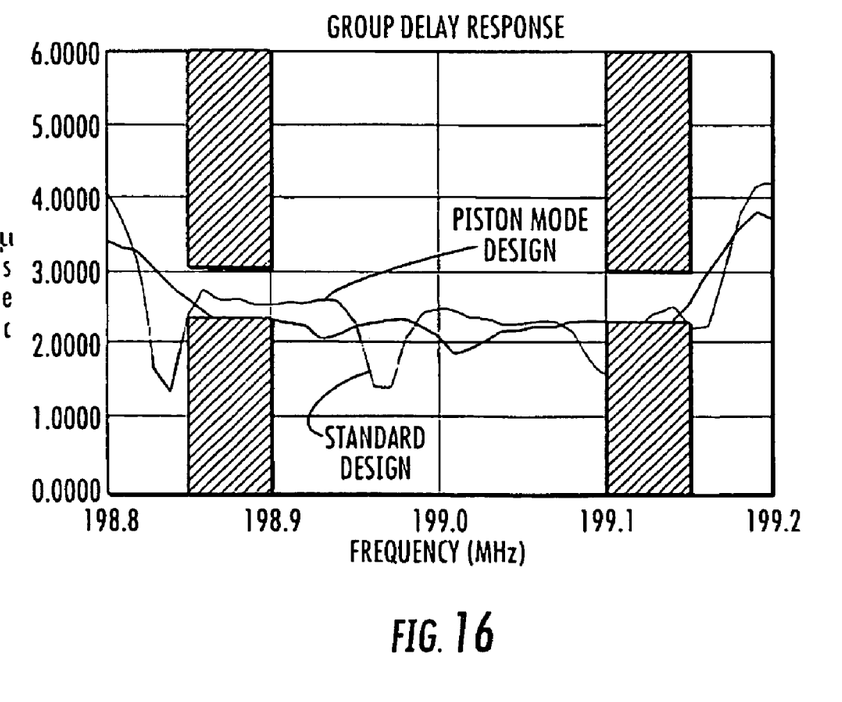
Figure 17:
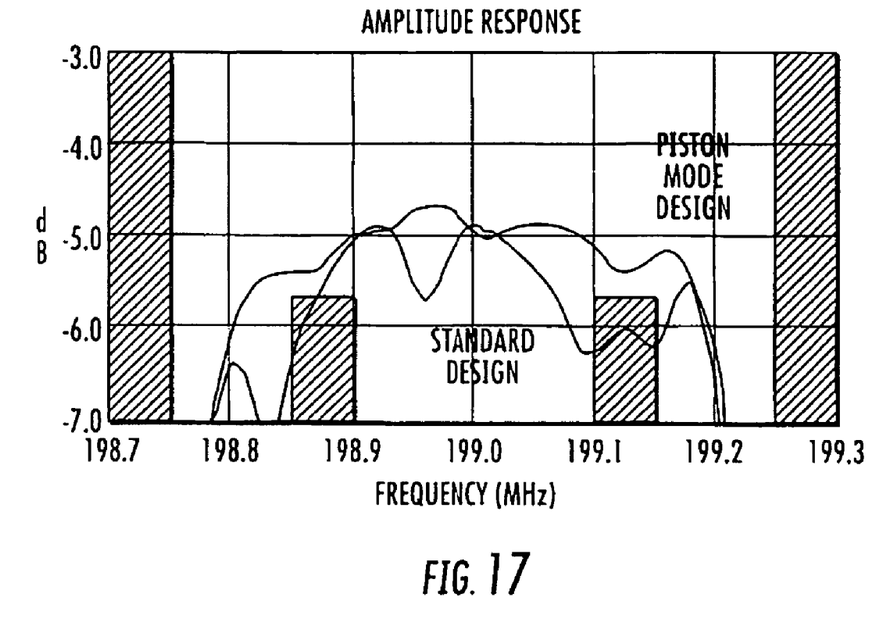

The teachings of the present invention and one embodiment herein described by way of example were used for a 199 MHz GSM IF filter. FIGS. 15-17 illustrate the effect on the response for a narrow aperture device (60 lambdas) for a standard design and a piston mode design. An improvement in filter response is clearly seen.

While one SPUDT device is herein described by way of example, a similar approach can be used for a coupled resonator device (i.e. device having two electrodes per wavelength transducer) or for a dual track or multitrack SPUDT device.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A SAW transducer comprising;
   a piezoelectric substrate;
   a pair of opposing bus bars formed on a surface of the substrate; and a plurality of interdigital electrodes extending from each of the opposing bus bars, wherein a center region and opposing edge regions including portions of the electrodes are formed along a wave propagation axis, wherein each edge region is formed proximate each bus bar and includes portions of the electrodes within the edge region such that a wave velocity in each edge region is substantially lower than a wave velocity in the bus bars and in the center region, and wherein electro-acoustic sources extend from the center region into the edge regions, thus defining a source aperture of the transducer.

2. A SAW transducer according to claim 1, wherein the velocity and the electrode width of electrodes in the edge regions are chosen to have a propagating mode substantially flat in the center region.

3. A SAW transducer according to 1, wherein a metal thickness of the electrode portions in the edge region is greater than the metal thickness of the electrodes in the center region so as to result in the substantially lower velocity in the edge region.

4. A SAW transducer according to claim 1, wherein a duty factor for electrode portions in the edge region is greater than the duty factor of the electrode portions in the center region so as to result in the substantially lower velocity in the edge region.

5. A SAW transducer according to claim 1, wherein a dielectric layer is on a top surface of only the electrode portions in the edge region so as to result in the substantially lower velocity in the edge region.

6. SAW transducer according to claim 1, wherein a dielectric layer is only on a bottom surface of the electrode portions in the edge region and not on the electrodes in the center region so as to result in the substantially lower velocity in the edge region.

7. A SAW transducer according to claim 1, wherein more acoustic energy is generated by the transducer in one direction or is more sensitive to the acoustic energy coming from the one direction.

8. A SAW transducer according to claim 7, wherein some of the electrode widths are modified so as to form acoustic reflectors, and wherein directionality is a result of acoustic reflections.

9. A SAW transducer according to a claim 8, wherein the acoustic reflectors are present in the edge regions.

10. A SAW transducer according to claim 9, wherein a cell in the edge region comprises $7\lambda/16$ wide reflectors and $3\lambda/16$ wide source electrodes.

11. A SAW transducer according to claim 1, wherein electrode portions in the edge regions provide a source aperture greater than an aperture of the center region.

12. A SAW transducer according to claim 1, wherein the transducer forms at least a portion of a SAW filter.

13. A SAW transducer comprising;

a piezoelectric substrate;

a pair of opposing bus bars formed on a surface of the substrate; and a plurality of interdigital electrodes extending from each of the opposing bus bars, at least a portion of the plurality of interdigital electrodes having ends attached to the opposing bus bars and free ends displaced from the opposing bus bars, wherein an edge region of the electrodes is formed along a wave propagation axis proximate each of the opposing bus bars and a center region thereof is formed between the edge regions, wherein electrode portions within each edge region comprise at least one of a metal thickness greater than the metal thickness of the electrode portion within the center region, a width greater than the width of the electrode portion within the center region, and a dielectric layer thereon and not on the electrode portion within the center region, and wherein the electrode portions within the edge regions support a wave velocity in each edge region substantially lower than a wave velocity in the opposing bus bars and within the center region.

14. A SAW transducer according to claim 13, wherein the electrode width of the electrodes within the edge regions provide a substantially flat propagating wave mode in the center region.

15. A SAW transducer according to claim 13, wherein a duty factor for electrode portions in the edge region is greater than the duty factor of the electrode portions in the center region so as to result in the substantially lower velocity in the edge region relative to the wave velocity in the center region.

16. A SAW transducer according to claim 13, wherein the dielectric layer is on at least one of a top surface and a bottom surface.

17. A SAW transducer according to claim 13, wherein some of the electrode widths are modified so as to form acoustic reflectors extending from the opposing bus bars, the acoustic reflectors distributed within the plurality of electrodes for providing directionality to acoustic energy generated by the transducer.

18. A SAW transducer according to claim 13, wherein electrode portions in the edge regions are dimensioned for providing one of a source aperture greater than an aperture of the center region.

* * * * *